(12) United States Patent
Goossens et al.

(10) Patent No.: US 11,811,378 B2
(45) Date of Patent: Nov. 7, 2023

(54) ELECTRONIC DEVICE AND A METHOD FOR SUPPRESSING NOISE FOR AN ELECTRONIC DEVICE

(71) Applicants: FUNDACIÓ INSTITUT DE CIÈNCIES FOTÒNIQUES, Castelldefels (ES); INSTITUCIÓ CATALANA DE RECERCA I ESTUDIS AVANÇATS, Barcelona (ES)

(72) Inventors: Stijn Goossens, Castelldefels (ES); Frank Koppens, Castelldefels (ES); Gerasimos Konstantatos, Castelldefels (ES); Carles Monasterio, Castelldefels (ES)

(73) Assignees: FUNDACIÓ, INSTITUT DE CIENCIES FOTÒNIQUES, Castelldefels (ES); INSTITUCIÓ CATALANA DE RECERCA I ESTUDIS AVANÇATS, Barcelona (ES)

( * ) Notice: Subject to any disclaimer, the term of this patent is extended or adjusted under 35 U.S.C. 154(b) by 290 days.

(21) Appl. No.: 17/423,238

(22) PCT Filed: Dec. 24, 2019

(86) PCT No.: PCT/EP2019/087012
§ 371 (c)(1),
(2) Date: Jul. 15, 2021

(87) PCT Pub. No.: WO2020/148075
PCT Pub. Date: Jul. 23, 2020

(65) Prior Publication Data
US 2022/0131529 A1      Apr. 28, 2022

(30) Foreign Application Priority Data

Jan. 16, 2019   (EP) .................................... 19382025

(51) Int. Cl.
*H03H 11/12*        (2006.01)
*C01B 32/182*       (2017.01)
(Continued)

(52) U.S. Cl.
CPC ....... *H03H 11/1217* (2013.01); *C01B 32/182* (2017.08); *H01L 29/1606* (2013.01); *H01L 29/786* (2013.01)

(58) Field of Classification Search
CPC .... H03D 7/04; H03H 11/525; H03H 11/1217; H03F 3/193; H03F 1/26; H03F 1/565;
(Continued)

(56) References Cited

U.S. PATENT DOCUMENTS 8,593,180 B2 * 11/2013 Han ................. H01L 29/78684
977/734
2013/0234762 A1 * 9/2013 Han ................. H01L 29/78684
257/E29.245
(Continued)

FOREIGN PATENT DOCUMENTS

EP        3 429 190        1/2019

OTHER PUBLICATIONS

International Search Report corresponding to International Patent Application No. PCT/EP2019/084591 dated May 8, 2020.
(Continued)

*Primary Examiner* — John W Poos
(74) *Attorney, Agent, or Firm* — Jenkins, Taylor & Hunt P.A.

(57) ABSTRACT

The present invention relates to an electronic device, comprising: —a GFET; —noise suppression means comprising: —a modulation unit applying to a gate (G) of the GFET a signal $V_g$ with frequency $f_m$ to modulate charge carrier density of a graphene channel around the charge neutrality point between charge carrier density values at frequency $f_m$,
(Continued)

—a control unit (CU), and—a demodulation circuit which is CMOS-implemented and that: —comprises first and second circuital branches alternately switchable to demodulate an electrical signal of frequency $f_m$; or—is configured to generate and apply a signal $V_b$ with frequency $f_{mb}$ to a source (S) of the GFET continuously, simultaneously and with a delay $t_d$ to induce a phase with respect to $V_g$ to yield a maximal demodulated output signal (So). The present invention also concerns to a method for suppressing noise for the device of the invention.

17 Claims, 9 Drawing Sheets

(51) Int. Cl.
*H01L 29/16* (2006.01)
*H01L 29/786* (2006.01)

(58) Field of Classification Search
CPC . C01B 32/182; H01L 29/1606; H01L 29/786; H01L 29/78; H01L 31/10; H01L 29/778; H01L 29/66045; H01L 29/78684; H01L 21/02527; H01L 29/7391; H01L 29/66742; H01L 29/775; H01L 29/78648; H01L 31/035218; H01L 29/42392; H01L 31/028; H01L 29/7781; H01L 29/42384; H01L 29/42356; H01L 29/1033; H01L 29/78696; H01L 29/66037; H01L 21/044; H01L 29/41775; H01L 31/1136; H01L 29/66431; H01L 29/45; G01K 7/01; G01L 1/2293; G01N 27/414; G01N 27/4146; G01J 1/44
See application file for complete search history.

(56) References Cited

U.S. PATENT DOCUMENTS

| | | | | |
|---|---|---|---|---|
| 2014/0022025 A1* | 1/2014 | Jenkins | ............... | H03B 7/06 331/116 FE |
| 2016/0254790 A1* | 9/2016 | Lyu | ............... | H03F 1/18 330/296 |

OTHER PUBLICATIONS

Klekachev et al. (2013) Graphene Transistors and Photodetectors. Interface, vol. 22, No. 1, pp. 63-68.
Nikitskiy et al (2016) Integrating an electrically active colloidal quantum dot photodiode with a graphene phototransistor. Nature Communications, vol. 7, p. 11954.
Written Opinion corresponding to International Patent Application No. PCT/EP2019/084591 dated Jul. 23, 2020.

* cited by examiner

ELECTRONIC DEVICE AND A METHOD FOR SUPPRESSING NOISE FOR AN ELECTRONIC DEVICE

FIELD OF THE INVENTION

The present invention relates, in a first and second aspects, to an electronic device comprising a GFET (Graphene Field Effect Transistor) and noise suppression means with a modulation mechanism for modulating the graphene charge carrier density around its charge neutrality point and a demodulator which is complementary metal oxide-semiconductor (CMOS)-implemented, allowing for a noise suppression for a digital CMOS readout implementation.

A third aspect of the present invention relates to a method for suppressing noise for an electronic device according to the first and/or second aspects of the invention.

BACKGROUND OF THE INVENTION

Electronic devices which comprise the features of the preamble clause of claim 1 of the present invention are known in the art, i.e. those which comprise:
- a graphene field effect transistor (GFET); and
- noise suppression means comprising a modulation unit configured to generate and apply to a gate electrode structure of said GFET a voltage oscillating time-dependent signal having at least one component with a frequency of $f_m$ and that oscillates between first and second voltage values selected so that charge carrier density of a graphene channel of the GFET is modulated around the charge neutrality point of the graphene between charge carrier density values at at least said frequency $f_m$.

Although said known devices improve the 1/f noise suppression in comparison with those devices which GFET are operated at the point of maximum transconductance, the results obtained in terms of noise suppression are clearly improvable. Also, said known devices are designed only for an analogue implementation, where the voltage oscillating time-dependent signal used for gate modulation is a sinusoidal signal, and the read-out is performed also by analogue circuitry.

In the present document, by GFET is to be understood a FET with a graphene channel formed by one or more layers off graphene (e.g. bilayer graphene, trilayer graphene, twisted bilayer graphene, twisted trilayer graphene), generally up to 10 layers.

It is, therefore, necessary to provide an alternative to the state of the art which covers the gaps found therein, by providing an electronic device including the features described above, but which does not possess the above mentioned drawbacks, and is designed for a digital read-out and improves and specifically focuses the noise suppression to that digital read-out.

SUMMARY OF THE INVENTION

To that end, the present invention relates, in a first aspect, to an electronic device, comprising:
- a graphene field effect transistor (GFET); and
- noise suppression means comprising a modulation unit configured to generate and apply to a gate electrode structure of said GFET a voltage oscillating time-dependent signal having at least one component with a frequency of $f_m$ and that oscillates between first and second voltage values selected so that charge carrier density of a graphene channel of the GFET is modulated around the charge neutrality point of the graphene between charge carrier density values at at least said frequency $f_m$.

In contrast to the electronic devices of the state of the art, in the one of the first aspect of the invention the noise suppression means comprises a control unit, and a demodulation circuit which is CMOS-implemented and that comprises first and second circuital branches which are alternately switchable, under the control of said control unit, to demodulate at least an electrical signal of frequency $f_m$ of a modulated electrical current circulating through the graphene channel of the GFET when is under said modulation around the charge neutrality point of the graphene.

Generally, the above mentioned control unit is configured also to generate and apply to the gate electrode structure of the GFET the voltage oscillating time-dependent signal having at least one component with a frequency of $f_m$ and that oscillates between first and second voltage values, and is generally a pulse signal.

For an embodiment, the modulation unit is also CMOS-implemented.

According to an embodiment, all the CMOS-implemented components of the device of the present invention (of the first and second aspects) are embedded in a CMOS read-out chip, while the GFET is outside of said chip, for some embodiments, or also embedded therein, for other embodiments.

The present invention is generally applied to graphene based sensing devices that rely sensing a change in conductance of the graphene channel induced by an external physical quantity, whether directly on an exposed graphene layer, through the intermediation of a sensitizing layer (such as a photo-sensitizing layer, for example made up of PbS colloidal quantum dots, where light can induce the charge carriers in graphene, or a linker biomolecule grafted on the graphene) or through the functionalization of the graphene layer (e.g. for biosensing). However, the present invention also covers non-sensing applications, for which the use of a device comprising a GFET can also be of interest (for example, for miniaturization purposes).

The graphene channel of the GFET of the device of the present invention comprises one or more graphene layers of at least one of the following three categories: pure graphene, modified graphene and functionalized graphene.

In the present document, pure graphene refers to a continuous sheet of (polycrystalline or monocrystalline) monolayer or few layer (up to 10) graphene that can be patterned in different ways to realize the following sensors:
- Strain sensors: by stretching the graphene its conductance is modified.
- Charge sensors: for example for sensing absorbed gas molecules or sensing neuronal signals, the analyte of interest transfers charge to the graphene or induces and electric field that modifies the conductance of the graphene. Another application is for direct sensing of in vivo electrical signals.
- Pressure sensors: graphene is placed between two volumes and deforms when there is a pressure difference between the two regions; this deformation induces a change in conductance.

In the present document, modified graphene refers to a sheet of graphene that is structurally or chemically modified to realize the following sensors:
- Strain sensors: by stretching the graphene its conductance is modified.

Temperature sensors: a difference in temperature induces a change in conductance.

Biosensors using chemically bonded linker molecules that enhance the selectivity for specific bio-molecules. When the molecule of interest binds to the linker, it transfer charge to the graphene or induces an electric in the graphene. This modifies the conductance of the graphene.

In the present document, functionalized graphene refers to a continuous sheet of (polycrystalline or monocrystalline) graphene that is functionalized with a physisorbed layer that sensitizes the graphene to one of the following analytes:

Light: using for example colloidal quantum dots in the opto-electronic device as referred to in other embodiments in this document.

Biomolecules with physisorbed linker molecules. When the molecule of interest binds to the linker, it transfers charge to the graphene or induces an electric in the graphene. This modifies the conductance of the graphene.

For some embodiments, including but not limited to those called below Embodiments 1, 2, and 3, the first and second circuital branches are alternately switchable, under the control of the control unit, for respectively sampling first and second portions of at least said electrical signal of frequency $f_m$ of a modulated electrical current circulating through the graphene channel when the GFET is biased and the graphene channel is under said modulation around the charge neutrality point of the graphene.

For some implementations of said embodiments, the demodulation circuit of the electronic device of the first aspect of the present invention comprises:

a high-pass filter having a cut off frequency $f_{c1} < f_m$ and that electrically connects an output of the GFET through which said modulated electrical current goes out, or of a further component electrically connected to said output, with an input of said demodulation circuit; and a post-processing unit electrically connected to respective outputs of said first and second circuital branches to receive, under the control of said control unit, said sampled first and second portions, and configured to process the same to provide a demodulated output signal.

For some embodiments, said post-processing unit is also CMOS-implemented.

Examples of this processing performed by the post-processing unit include linear combinations of the sampled first and second portions, for example additions, subtractions (for example, carried out by means of an analogue differential amplifier or a differential analogue to digital converter), or weighted additions and subtractions.

For some embodiments, called herein and below Embodiments 1 and 2, each of the first and second circuital branches comprises:

a switch configured and arranged to electrically connect or disconnect the input of the demodulation circuit with the output of the respective circuital branch, when in a respective on or off state induced by the control unit; and a capacitor electrically connected between the output of the respective circuital branch and a ground point and that is configured and arranged to be charged with an electrical current circulating through the switch when in said on state;

wherein the post-processing unit is configured to receive the sampled first and second portions by measuring, under the control of the control unit, the magnitude of the electrical charge stored on the respective charged capacitor; and and wherein the demodulation circuit further comprises at least one reset circuit configured and arranged to drain, under the control of the control unit, the electrical charge stored on the capacitors.

For Embodiment 2, the demodulation circuit of the electronic device of the first aspect of the present invention comprises the above mentioned further component electrically connected between the output of the GFET and the high-pass filter, wherein said further component is a transimpedance or capacitive transimpedance amplifier.

For a further embodiment, called herein and below Embodiment 3, of the electronic device of the first aspect of the present invention, each of the first and second circuital branches comprises:

a switch configured and arranged to electrically connect or disconnect said input of the demodulation circuit with the output of the respective circuital branch, when in a respective on or off state induced by said control unit;

a capacitive transimpedance amplifier with an input electrically connected between said switch and the output of the respective circuital branch, wherein said capacitive transimpedance amplifier comprises, electrically connected in parallel with each other:

an operational amplifier, a capacitor configured and arranged to be charged with an electrical current circulating through said switch when in said on state, and a reset circuit configured and arranged to drain, under the control of the control unit, the electrical charge stored on the capacitor;

wherein the post-processing unit is configured to receive the sampled first and second portions by measuring, under the control of the control unit, the magnitude of the electrical signal provided by the operation amplifier when the respective capacitor is charged.

For an implementation of any of Embodiments 1, 2 and 3, the control unit is configured to control the above mentioned switches, the post-processing unit, and the at least one reset circuit, to operate according to a reading mode that comprises:

inducing the on state of the switch of the first circuital branch along a time $t_{int1}$ that coincides with at least part of the time during which the first voltage value of the voltage oscillating time-dependent signal is being applied to the gate electrode structure of the GFET;

inducing the off state of the switch of the first circuital branch;

inducing the on state of the switch of the second circuital branch along a time $t_{int2}$ that coincides with at least part of the time during which the second voltage value of the voltage oscillating time-dependent signal is being applied to the gate electrode structure of the GFET;

inducing the off state of the switch of the second circuital branch, once said $t_{int2}$ has lapsed;

controlling the at least one reset circuit or reset circuits, to drain the electrical charge stored on the capacitors, after said $t_{int2}$ has lapsed;

controlling the post-processing unit to obtain a signal out by performing, and then processing, the following measurements:

during $t_{int1}$ or $t_{int2}$:

the magnitude of the electrical charge stored on the charged capacitor of the first circuital branch; or the magnitude of the electrical signal provided by the operation amplifier of the first circuital branch when the respective capacitor is charged;

during $t_{int2}$:

the magnitude of the electrical charge stored on the charged capacitor of the second circuital branch; or the magnitude of the electrical signal provided by the operation amplifier of the second circuital branch when the respective capacitor is charged.

For some embodiments, the GFET of the electronic device of the first aspect of the present invention does not comprise any sensitizing or functionalizing structure over the graphene channel (constituted by at least one graphene layer), so that the graphene channel is exposed to an analyte or phenomenon to be sensed that can induce and/or alter the charge carrier density of the graphene channel without the need of such a sensitizing structure.

However, for other embodiments, the GFET further comprises a sensitizing or functionalizing structure arranged over the graphene channel, wherein said sensitizing structure is configured to induce charge carriers and/or modify the charge carrier density therein induced by an external physical quantity.

For an implementation of said embodiments, the sensitizing or functionalizing structure is an actively controlled sensitizing or functionalizing structure, and the electronic device of the first aspect of the present invention further comprises a drift compensation mechanism to compensate an unwanted drift caused by the graphene of the GFET, said drift compensation mechanism comprising a control electrode electrically connected to the actively controlled sensitizing or functionalizing structure and the control unit being configured to operate in a drift compensation mode.

For a variant of said implementation, when in said drift compensation mode, the control unit is configured to perform the actions of the above described reading mode while applying to the control electrode a voltage $V_{on}$ that turns on the actively controlled sensitizing or functionalizing structure to generate charges that can be sensed by the graphene channel by changing its conductance induced by an external physical quantity, to obtain the above mentioned signal out, and, once the charge stored on the capacitors is drained, perform the following actions:

applying a voltage $V_{off}$ to the control electrode, during a time $t_{int1}+t_{int2}$, to tune the actively controlled sensitizing or functionalizing structure to a condition where a change in said external physical quantity does not lead to a change in charge carrier density in the graphene channel;

inducing the on state of the switch of the first circuital branch along a time $t_{int1}$ that coincides with at least part of the time during which the first voltage value of the voltage oscillating time-dependent signal is being applied to the gate electrode structure of the GFET;

inducing the off state of the switch of the first circuital branch;

inducing the on state of the switch of the second circuital branch along a time $t_{int2}$ that coincides with at least part of the time during which the second voltage value of the voltage oscillating time-dependent signal is being applied to the gate electrode structure of the GFET;

inducing the off state of the switch of the second circuital branch, once said $t_{int2}$ has lapsed;

controlling the at least one reset circuit or reset circuits, to drain the electrical charge stored on the capacitors, after said $t_{int2}$ has lapsed;

controlling the post-processing unit to obtain a drift correction out by performing, and then processing, the following measurements representative of a drift charge:

during $t_{int1}$ or $t_{int2}$:

the magnitude of the electrical charge stored on the capacitor of the first circuital branch; or the magnitude of the electrical signal provided by the operation amplifier of the first circuital branch when the respective capacitor has been charged;

during $t_{int2}$:

the magnitude of the electrical charge stored on the capacitor of the second circuital branch; or the magnitude of the electrical signal provided by the operation amplifier of the second circuital branch when the respective capacitor has been charged;

adjust the first and second voltage values of the voltage oscillating time-dependent signal based on said drift correction out, and use said adjusted first and second voltage values to perform subsequent reading modes, to compensate said unwanted drift therein.

A second aspect of the present invention concerns to an electronic device, comprising:

a graphene field effect transistor (GFET); and noise suppression means comprising a modulation unit configured to generate and continuously apply to a gate electrode structure of said GFET a voltage oscillating time-dependent signal having at least one component with a frequency of $f_m$ and that oscillates between first and second voltage values selected so that charge carrier density of a graphene channel of the GFET is modulated around the charge neutrality point of the graphene between charge carrier density values at at least said frequency $f_m$.

In contrast to the electronic devices of the state of the art, in the one of the second aspect of the present invention the noise suppression means comprises a control unit, and a demodulation circuit which is CMOS-implemented and is configured to, under the control of said control unit, generate a bias voltage oscillating time-dependent signal having at least one component with a frequency of $f_{mb}$ and that oscillates between first and second voltage values, and apply the same to a source electrode structure of the GFET continuously, simultaneously and with a delay $t_d$ to induce a phase $\varphi=2\pi \cdot f_{mb} \cdot t_d$ with respect to the voltage oscillating time-dependent signal applied to the gate electrode structure, wherein said delay $t_d$ is selected to optimize the conditions to demodulate at least an electrical signal of frequency $f_m$ of a modulated electrical current circulating through the graphene channel of the GFET when is under said modulation around the charge neutrality point of the graphene and yield a maximal demodulated output signal.

For an embodiment of the device of the second aspect of the present invention, called below Embodiment 4, the demodulation circuit of the device further comprises a low-pass filter having a cut frequency $f_{c2}<f_m, f_{mb}$ and with an input that is electrically connected to a drain electrode structure of the GFET, to filter and provide at an output of the low-pass filter the electrical signal corresponding to the induced on the GFET, with or without a DC offset. Using the here described bias modulation the signal will be demodulated, so it is at DC when there is homodyne detection ($f_m=f_{mb}$), or at a frequency $f_{demod}<f_m, f_{mb}$ for heterodyne detection ($f_m \neq f_{mb}$). Both modulation frequencies $f_m$ and $f_{mb}$ should not pass through the low-pass filter.

For a variant of said embodiment, the device further comprises an offset correction unit connected to the output of the low-pass filter to correct such a possible DC offset.

For an implementation of said Embodiment 4, the low-pass filter is an active filter already performing an impedance matching function, while for an alternative embodiment, the low-pass filter is passive and the device further comprises an impedance matching unit interconnected between the drain electrode structure of the GFET and the input of the passive low-pass filter.

Generally, the switches described above for different embodiments of the device of the first and second aspects of the present invention are transistors, such as FETs (Field Effect Transistors), so that their on and off states are induced by the application, by means of the control unit, of corresponding gate voltages thereto.

A third aspect of the present invention relates to a method for suppressing noise for an electronic device according to the first aspect of the invention, comprising performing the operations of the control unit thereof.

Further aspects of the present invention relate to uses of an electronic apparatus according to the first aspect of the invention, as any of the above listed sensors.

BRIEF DESCRIPTION OF THE FIGURES

In the following some preferred embodiments of the invention will be described with reference to the enclosed figures. They are provided only for illustration purposes without however limiting the scope of the invention.

DESCRIPTION OF THE PREFERRED EMBODIMENTS

Figure 1:
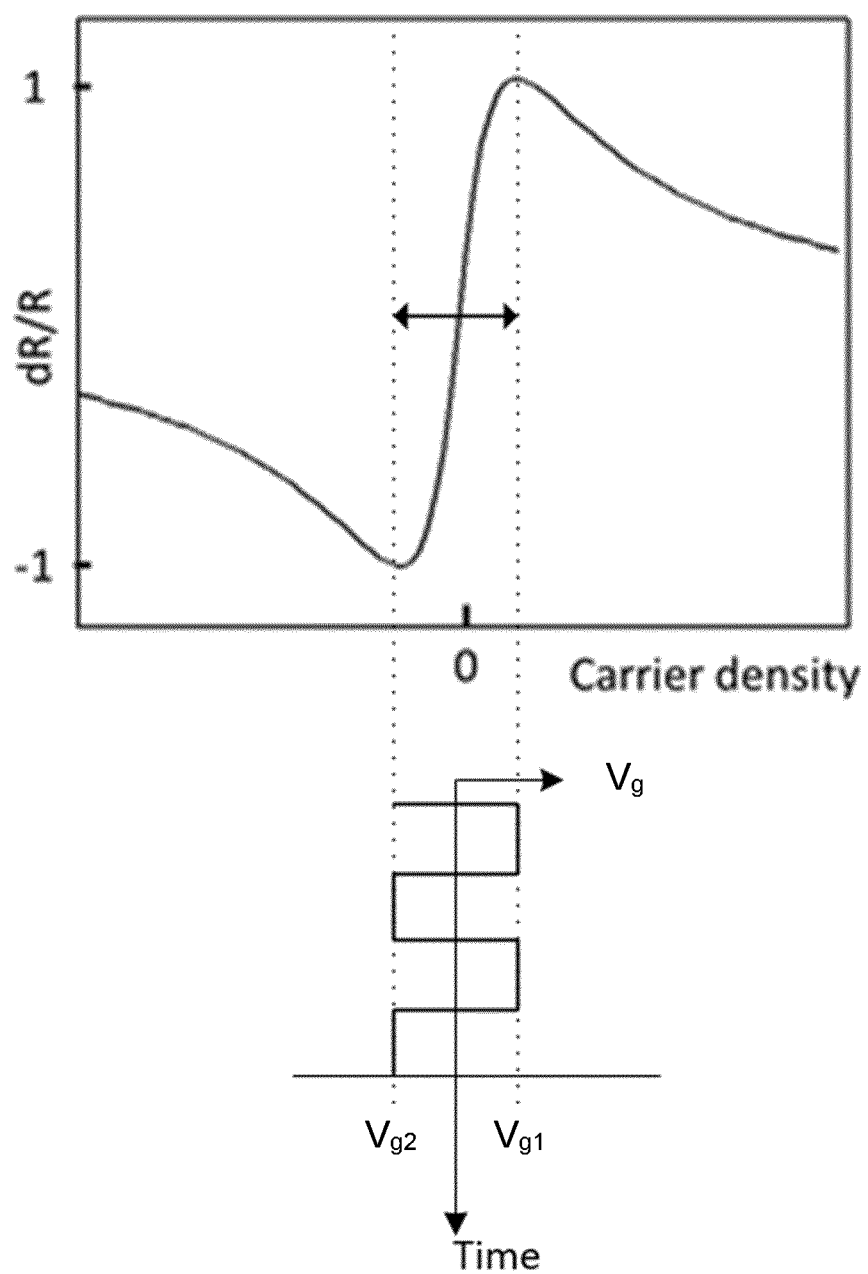
FIG. 1 shows the relative change of resistance dR/R in the graphene of the device of the present invention, for a given change in carrier density as a function of the total carrier density in the graphene. The arrow indicates the range over which the carrier density needs to be modulated to achieve optimal noise suppression. Below the main panel a time trace of the modulation signal of frequency that needs to be applied to the gate electrode structure of the GFET is represented.

In the present invention an electronic device comprising a GFET connected to four different demodulation circuits, for four respective embodiments, is disclosed. For all four embodiments the GFET has a gate electrode called G that can modulate the charge carrier density of the GFET. The voltage on the gate $V_g$ should be modulated around the charge neutrality point of the graphene (average carrier density=0) to achieve noise suppression, hence gate voltages $V_{g1}$ and $V_{g2}$ correspond to carrier densities with an opposite sign (once cancelled any possible DC offset, if so). The simplest way of implementing a modulation in CMOS is a square wave. FIG. 1 illustrates the modulation around the points where the relative change in resistance dR/R (directly proportional to Δn) using a square wave.

Figure 2:
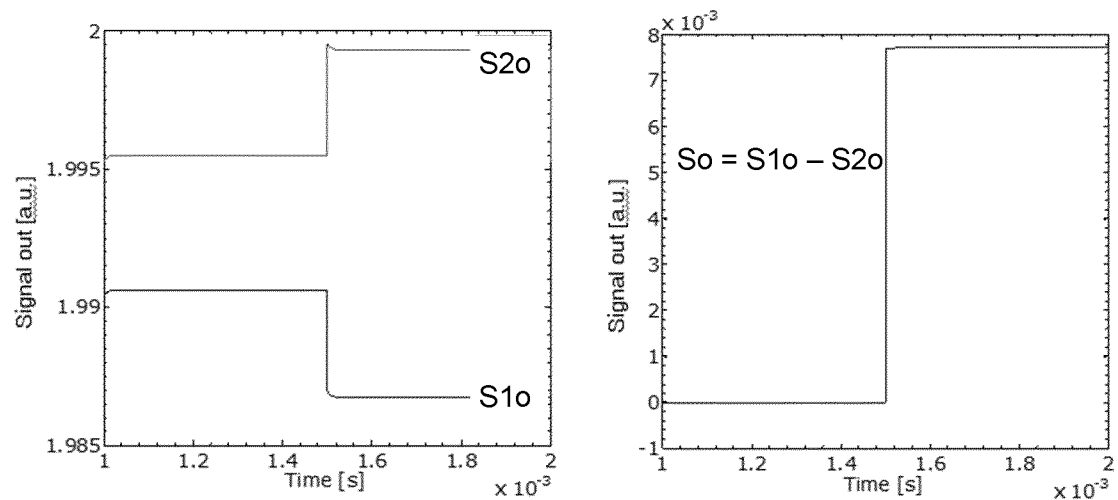
FIG. 2 shows simulation results of the device of the first aspect of the present invention for Embodiment 2, for a GFET that is switched from one carrier density level to another. On the left: voltages S1o and S2o as a function of time. On the right: So=S1o−S2o as a function of time.
Figure 3:
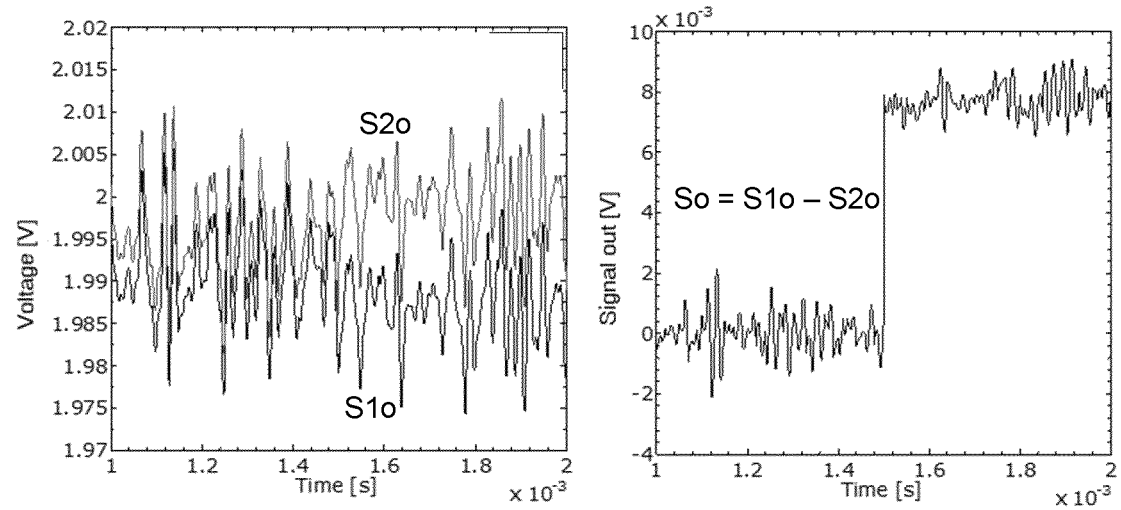
FIG. 3 shows simulation results of the device of the first aspect of the present invention for Embodiment 2, for a GFET that is switched from one carrier density level to another. In this simulation noise containing low frequency components of the GFET was added to the resistance. On the left: voltages S1o and S2o as a function of time. On the right: So=S1o−S2o as a function of time. This signal clearly shows the noise suppression and demodulation functionality of the embodiment.

In FIG. 2 and FIG. 3 Spice simulations of a circuit according to Embodiment 2 are shown, to demonstrate that the demodulation and noise suppression work.

Embodiments 1, 2 and 3

In the following, the above identified as Embodiments 1, 2, 3, and 4 will be described with reference to the attached drawings.

Figure 4:
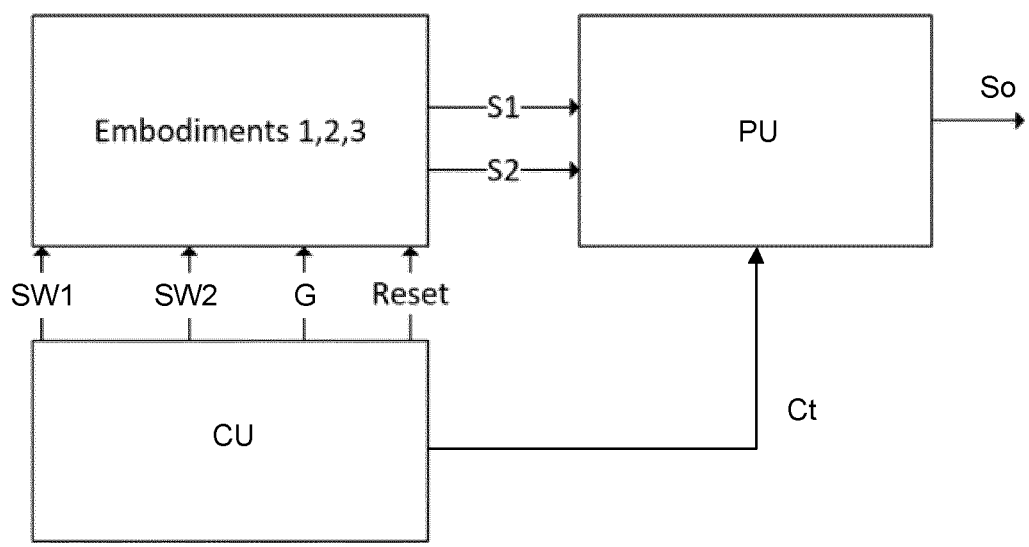
FIG. 4 shows a block diagram of the device of the first aspect of the present invention, showing the connections of the control unit and signal processing unit to the GFET and demodulation circuit (these two latter components have been identified just as "Embodiments 1, 2, 3"), for embodiments 1, 2 and 3.
Figure 5:
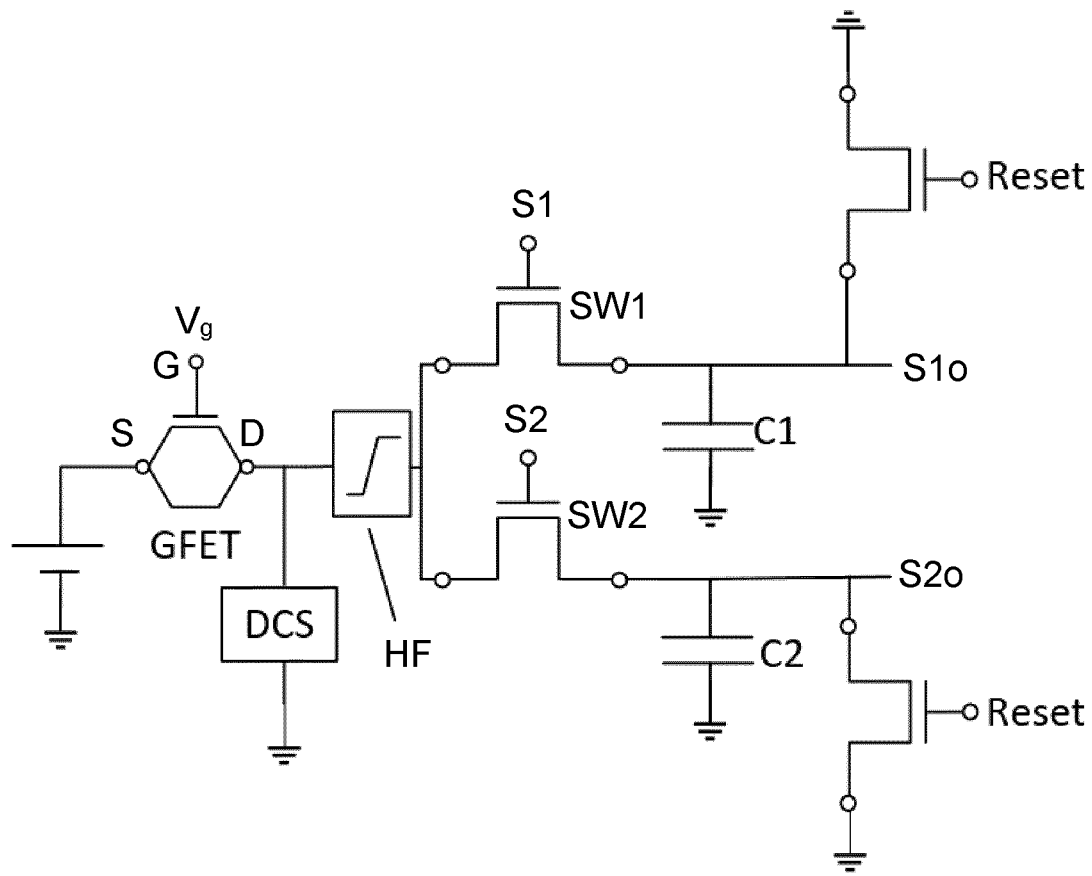
FIG. 5 is a schematic drawing of the device of the first aspect of the present invention, for Embodiment 1, including an optional dark current subtraction (DCS), which is not necessary to include when the high pass filter provide the DC dark current subtraction.
Figure 6:
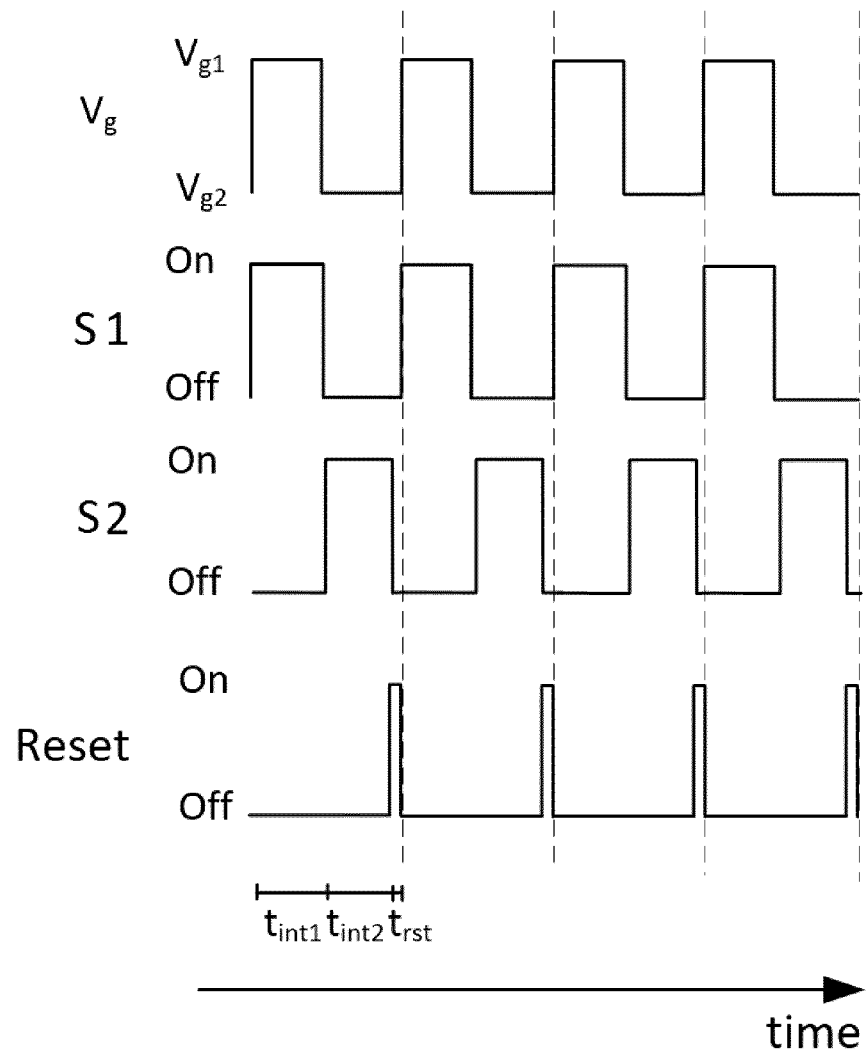
FIG. 6 shows the timing scheme for the demodulation circuit in Embodiments 1-3. Note that the pulse rise and fall times should be finite in reality.
Figure 7:
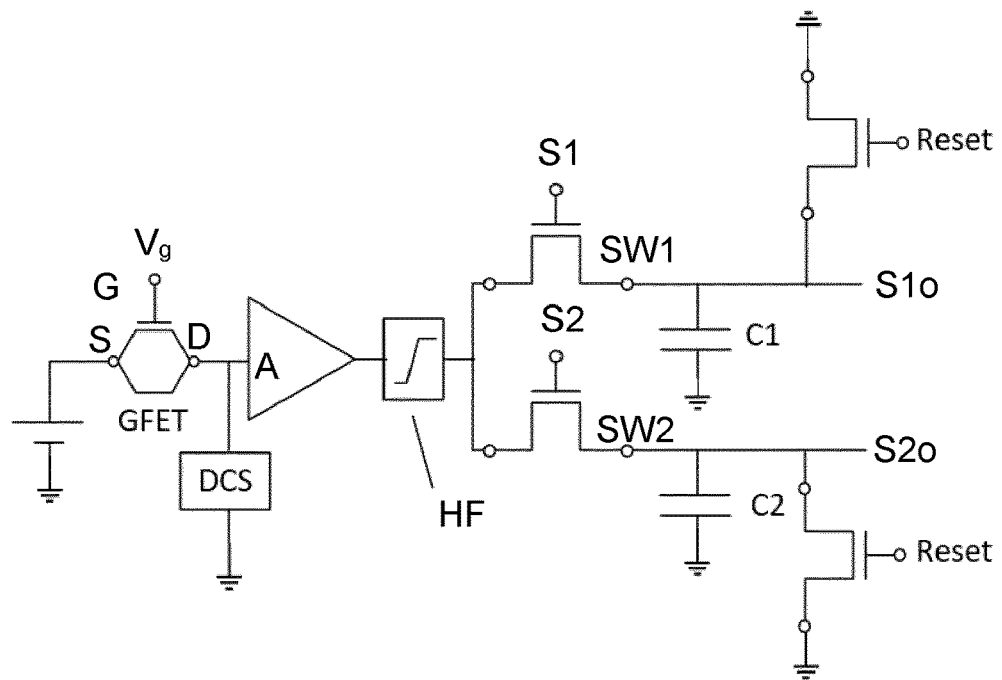
FIG. 7 is a schematic drawing of the device of the first aspect of the present invention, for Embodiment 2, including an optional dark current subtraction (DCS), which is not necessary to include when the gain of the amplifier is low.

Particularly, schematics representing Embodiments 1, 2 and 3 are respectively shown in FIGS. 5, 6, and 7, and by means of a block diagram in FIG. 4, and for all of them the electronic device of the first aspect of the present invention comprises:
a graphene field effect transistor GFET;
noise suppression means comprising:
 a modulation unit configured to generate and apply to a gate electrode structure G of said GFET a voltage oscillating time-dependent signal $V_g$ having at least one component with a frequency of $f_m$ and that oscillates between first $V_{g1}$ and second $V_{g2}$ voltage values selected so that charge carrier density of a graphene channel of the GFET is modulated around the charge neutrality point of the graphene between charge carrier density values at at least said frequency $f_m$,
 a control unit CU, and
 a demodulation circuit which is CMOS-implemented and that comprises first and second circuital branches which are alternately switchable, under the control of the control unit CU, to demodulate at least an electrical signal of frequency $f_m$ of a modulated electrical current circulating through the graphene channel of the GFET when is under said modulation around the charge neutrality point of the graphene.

For the illustrated implementation of those Embodiments 1, 2, and 3, the source S of the GFET is connected to a bias voltage source, and the drain to a dark current subtraction unit DCS, which is preferably of one of the following types: graphene field effect transistor, MOSFET, one CMOS resistor with resistance value corresponding to the GFET resistance at $V_{g1}$ and $V_{g2}$ (when the resistances are substantially equal), at least two CMOS resistors with corresponding values corresponding to the GFET resistance at $V_{g1}$ and $V_{g2}$ (when the two resistances are not substantially equal).

As shown in FIGS. 4, 5, 7, and 8, the first and second circuital branches are alternately switchable, under the control of the control unit CU, for respectively sampling first S1o and second S2o portions of the electrical signal of frequency $f_m$ of a modulated electrical current circulating through the graphene channel when the GFET is biased and the graphene channel is under said modulation around the charge neutrality point of the graphene.

As the noise that needs to be suppressed is 1/f noise, the GFET output signal is connected to the demodulation circuit through a high pass filter HF having a cut frequency $f_d < f_m$ and that electrically connects the drain D of the GFET through which the modulated electrical current goes out, or of a further component electrically connected to that drain D, with an input of the demodulation circuit.

This high pass filter HF can be implemented passive by using for example a capacitor or can be implemented by an active filter, preferably by using one of the following types: active resistor-capacitor, MOSFET-capacitor, transconductance-opamp-capacitor or switched capacitor.

The device also comprises a post-processing unit PU (see FIG. 4) electrically connected to respective outputs of the first and second circuital branches to receive, under the control of the control unit CU (that control is schematically represented by the arrow line Ct), the sampled first S1o and second S2o portions, and configured to process the same to provide a demodulated output signal So.

Those sampled first and second portions, or resulting voltages S1o and S2o, need to be further processed. Examples of this post-processing include linear combinations of S1o and S2o, for example additions, subtractions or weighted additions and subtractions.

To achieve noise suppression, one possibility is to process S1o and S2o differentially (S1o–S2o), for example by another analogue differential amplifier or a differential analogue to digital converter.

For Embodiments 1 and 2, as shown in FIGS. 5 and 7, respectively, each of the first and second circuital branches comprises:
 a switch SW1, SW2, particularly a FET, configured and arranged to electrically connect or disconnect the input of the demodulation circuit with the output of the respective circuital branch, when in a respective on or off state induced by the control unit CU, by means of the application of a gate voltage S1, S2; and
 a capacitor C1, C2 electrically connected between the output of the respective circuital branch and a ground point and that is configured and arranged to be charged with an electrical current circulating through the switch SW1, SW2 when in said on state.

The post-processing unit PU is configured to receive the sampled first S1o and second S2o portions by measuring/reading, under the control of the control unit CU, the magnitude of the electrical charge stored on the respective charged capacitor C1, C2, and the device further comprises reset circuits (one per branch) configured and arranged to drain, under the control of the control unit CU, the electrical charge stored on the capacitors C1, C2.

For Embodiment 2, as shown in FIG. 7, the device further comprises the above mentioned further component electrically connected between the drain D of the GFET and the high-pass filter HF, wherein that further component is a transimpedance or capacitive transimpedance amplifier A.

Figure 8:
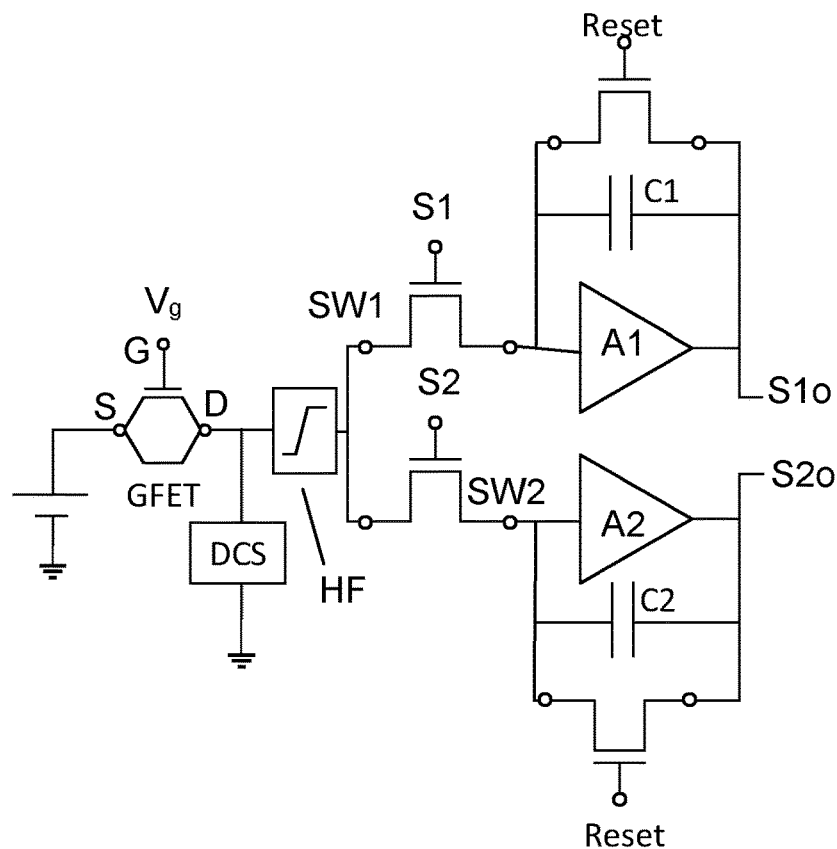
FIG. 8 is a schematic drawing of the device of the first aspect of the present invention, for Embodiment 3, including an optional dark current subtraction (DCS), which is not necessary to include when the high pass filter provide the DC dark current subtraction.

For Embodiment 3, as shown in FIG. 8, each of the first and second circuital branches comprises:
 a switch SW1, SW2, particularly a FET, configured and arranged to electrically connect or disconnect said input of the demodulation circuit with the output of the respective circuital branch, when in a respective on or off state induced by said control unit CU, by means of the application of a gate voltage S1, S2;
 a capacitive transimpedance amplifier with an input electrically connected between the switch SW1, SW2 and the output of the respective circuital branch, wherein that capacitive transimpedance amplifier comprises, electrically connected in parallel with each other:
 an operational amplifier A1, A2, a capacitor C1, C2 configured and arranged to be charged with an electrical current circulating through said switch SW1, SW2 when in said on state, and a reset circuit configured and arranged to drain, under the control of the control unit CU, the electrical charge stored on the capacitor C1, C2;

wherein the post-processing unit PU is configured to receive the sampled first S1o and second S2o portions by measuring/reading, under the control of the control unit CU, the magnitude of the electrical signal provided by the operation amplifier A1, A2 when the respective capacitor C1, C2 is charged.

FIG. 6 shows the timing sequence for the operation of Embodiments 1, 2, and 3, according to a reading mode for which the control unit CU is configured to control the switches SW1, SW2, the post-processing unit PU, and the reset circuits, to operate as follows:

applying a first voltage value $V_{g1}$ of the voltage oscillating time-dependent signal $V_g$ to the gate G of the GFET;

applying a voltage S1-on to the gate of the FET SW1 to induce its on state, along a time $t_{int1}$ that coincides with the time during which $V_{g1}$ is being applied to the gate G of the GFET. This leads a current to charge capacitor C1;

after time $t_{int1}$ the control unit CU sets $V_g$ to $V_{g2}$, S1 to off, and applies a voltage S2-on to the gate of the FET SW2 to induce its on-state along a time $t_{int2}$ that coincides with the time during which the second voltage value $V_{g2}$ is being applied to the gate G of the GFET. Now capacitor C2 gets charged;

after time $t_{int2}$ the control unit CU sets S2 to off and drains the charges on capacitors C1 and C2 by applying a voltage to put the 'reset' capacitors in the on-state during time $t_{rst}$;

then the control unit CU controls the post-processing unit PU to obtain a signal out So (corresponding to the carrier charge that the GFET is designed to sense when used for sensing applications) by performing, and then processing, the following measurements/readings:

during $t_{int1}$ (at any point during time $t_{int1}$, but preferably as close as possible to the end of $t_{int1}$) or during $t_{int2}$, to obtain S1o:

the magnitude of the electrical charge stored on the charged capacitor C1 of the first circuital branch, for Embodiments 1 and 2; or the magnitude of the electrical signal provided by the operation amplifier A1 of the first circuital branch when the respective capacitor C1 is charged, for Embodiment 3;

during $t_{int2}$ (preferably close to the end thereof), to obtain S2o:

the magnitude of the electrical charge stored on the charged capacitor C2 of the second circuital branch, for Embodiments 1 and 2; or the magnitude of the electrical signal provided by the operation amplifier A2 of the second circuital branch when the respective capacitor C2 is charged, for Embodiment 3.

Drift Compensation:

The GFET can contain an actively controlled sensitizing structure. An implementation of this for a photodetector is described by Nikitskiy et al. (Nikitskiy, I. et al. Integrating an electrically active colloidal quantum dot photodiode with a graphene phototransistor. Nat. Commun. 7, 11954 (2016). Using a control electrode Control 1 for the actively controlled sensitizing structure it is possible to add a drift compensation to the read-out schemes proposed in Embodiments 1, 2 and 3.

Drift is an unwanted shift in the doping of the graphene. This manifests itself as a resistance change when the gate of the GFET is set to a specific gate voltage. This drift can be compensated by tuning the gate voltage. In this drift compensation, an extension of the read-out schemes of embodiments 1-3 is performed to measure the drift, and then use the measured drift in a feedback control loop to adjust the values of $V_{g1}$ and $V_{g2}$.

Figure 14:
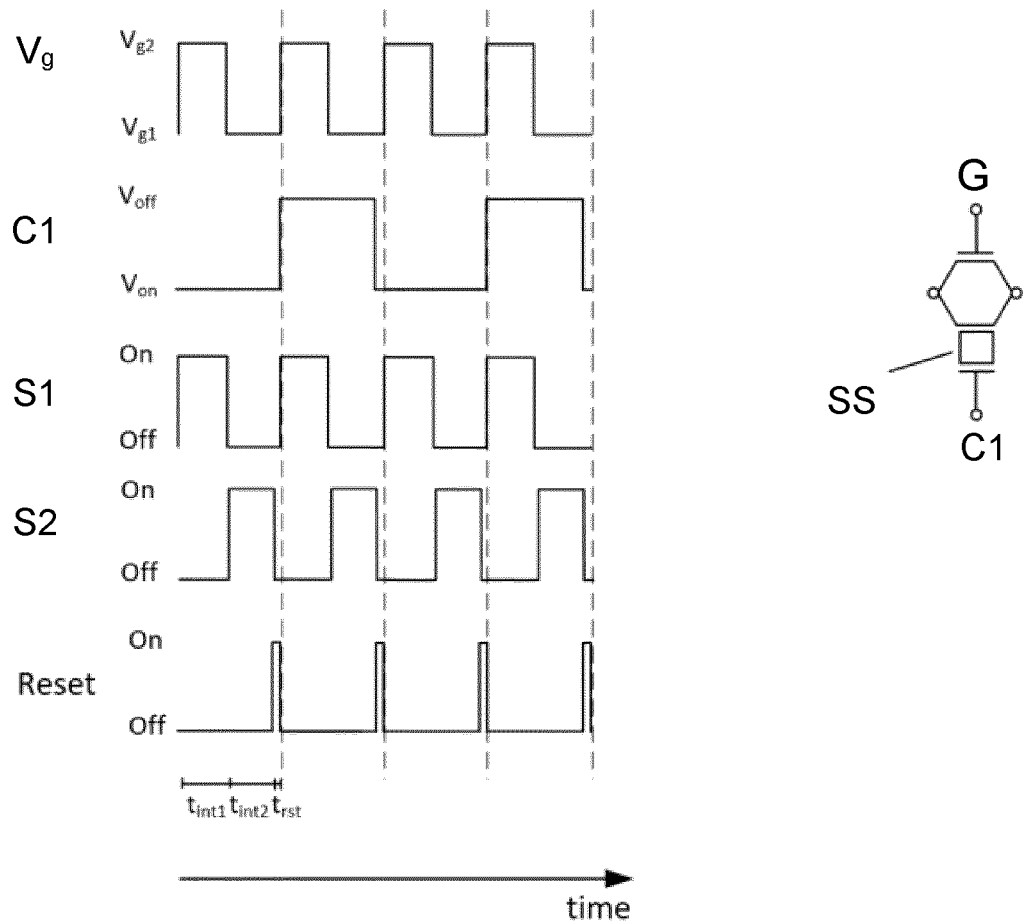
FIG. 14 depicts a timing sequence for the signals of the drift compensation mechanism in case the GFET device comprises active control over the sensitizing structure, as is symbolically illustrated on the right. Note that the pulse rise and fall times should be finite in reality. Also note that $V_{g1}$ and $V_{g2}$ are slightly different in the second sequence if drift is present in the GFET device.
Figure 15:
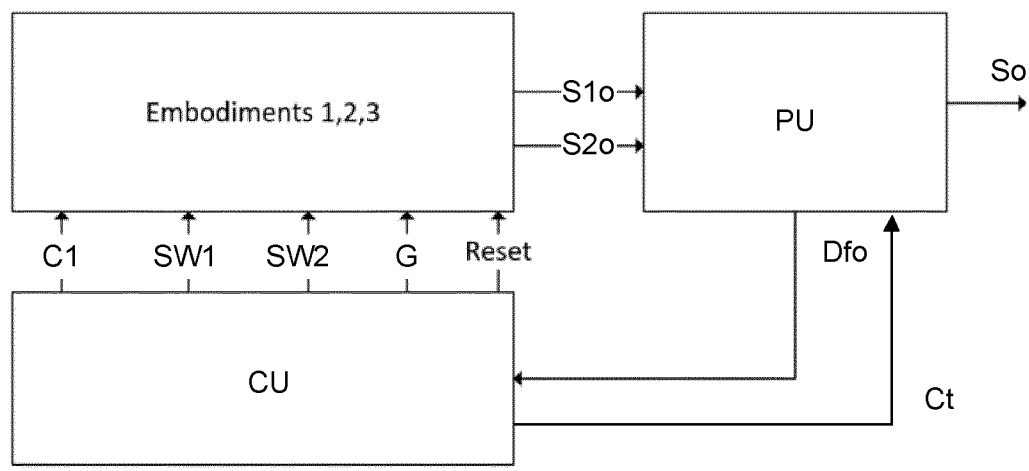
FIG. 15 is a block diagram of the device of the first aspect of the present invention, showing the connections of the control unit and signal processing unit to the GFET and demodulation circuit (these two latter components have been identified just as "Embodiments 1, 2, 3"), for embodiments 1, 2 and 3, with the implementation of a drift correction by means of the drift compensation mechanism.

A schematic representation of the GFET with the active sensitizing structure S and control electrode C1, together with a timing sequence of the control signals applied by the control unit CU are shown in FIG. 14, while a block diagram of the resulting embodiments incorporating the feedback control loop is shown in FIG. 15.

As shown in FIGS. 14 and 15, the GFET comprises an actively controlled sensitizing structure SS, and the device further comprises a drift compensation mechanism to compensate an unwanted drift caused by the graphene of the GFET, the drift compensation mechanism comprising a control electrode C1 electrically connected to the actively controlled sensitizing structure S and the control unit CU configured to operate in a drift compensation mode.

As shown in FIG. 15, in the drift compensation mode, the control unit CU is configured to perform the actions of the reading mode explained above for any of Embodiments 1, 2 or 3, but with the addition of the application first of a voltage $V_{on}$ to the control electrode C1 that corresponds to turning on the sensitizing structure to generate charges that can be sensed by the graphene, and the maintaining of that $V_{on}$ through said reading mode, until the signal out So is obtained and the capacitors C1, C2 are discharged.

Then, as shown in FIG. 15, the control unit is configured and arranged to perform the following actions:

applying $V_{g1}$ to the gate G of the GFET;

applying a voltage $V_{off}$ to the control electrode C1, during a time $t_{int1}+t_{int2}$, to tune the actively controlled sensitizing S to a condition where it cannot induce charge carrier into the graphene channel;

voltage S1-on to the gate of the FET SW1 to induce its on state, along a time tints that coincides with the time during which Vg1 is being applied to the gate G of the GFET. This leads a current to charge capacitor C1;

after time $t_{int1}$ the control unit CU sets $V_g$ to $V_{g2}$, S1 to off, and applies a voltage S2-on to the gate of the FET SW2 to induce its on-state along a time $t_{int2}$ that coincides with the time during which the second voltage value $V_{g2}$ is being applied to the gate G of the GFET. Now capacitor C2 gets charged;

after time $t_{int2}$ the control unit CU sets S2 to off and drains the charges on capacitors C1 and C2 by applying a voltage to put the 'reset' capacitors in the on-state during time $t_{rst}$;

then the control unit CU controls the post-processing unit PU (that control is schematically represented by the arrow line Ct), to obtain a drift correction out Dfo by performing, and then processing, the following measurements/readings representative of a drift charge:

during $t_{int1}$ (at any point during time $t_{int1}$, but preferably as close as possible to the end of $t_{int1}$) or during $t_{int2}$:

the magnitude of the electrical charge stored on the charged capacitor C1 of the first circuital branch, for Embodiments 1 and 2 incorporating the drift compensation mechanism; or the magnitude of the electrical signal provided by the operation amplifier A1 of the first circuital branch when the respective capacitor C1 is charged, for Embodiment 3 incorporating the drift compensation mechanism;

during $t_{int2}$ (preferably close to the end thereof):
the magnitude of the electrical charge stored on the charged capacitor C2 of the second circuital branch, for Embodiments 1 and 2 incorporating the drift compensation mechanism; or the magnitude of the electrical signal provided by the operation amplifier A2 of the second circuital branch when the respective capacitor C2 is charged, for Embodiment 3 incorporating the drift compensation mechanism.

adjust the first $V_{g1}$ and second $V_{g2}$ voltage values of the voltage oscillating time-dependent signal $V_g$ based on said drift correction out Dfo, and use said adjusted first $V_{g1}$ and second $V_{g2}$ voltage values to perform subsequent reading modes, to compensate the unwanted drift therein.

Embodiment 4

Figure 9:
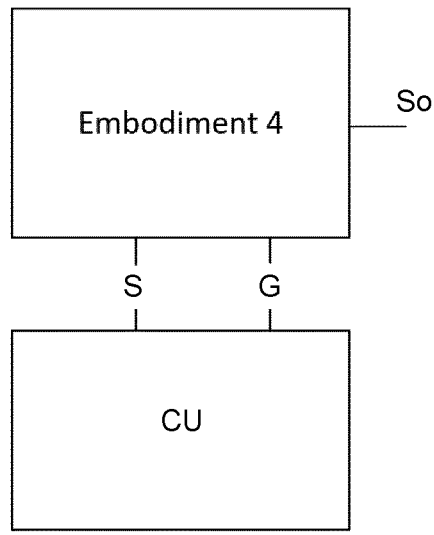
FIG. 9 is a block diagram of the device of the second aspect of the present invention, showing the connections of the control unit to the GFET for Embodiment 4, where the block identified as "Embodiment 4" includes that GFET and the demodulation circuit.
Figure 10:
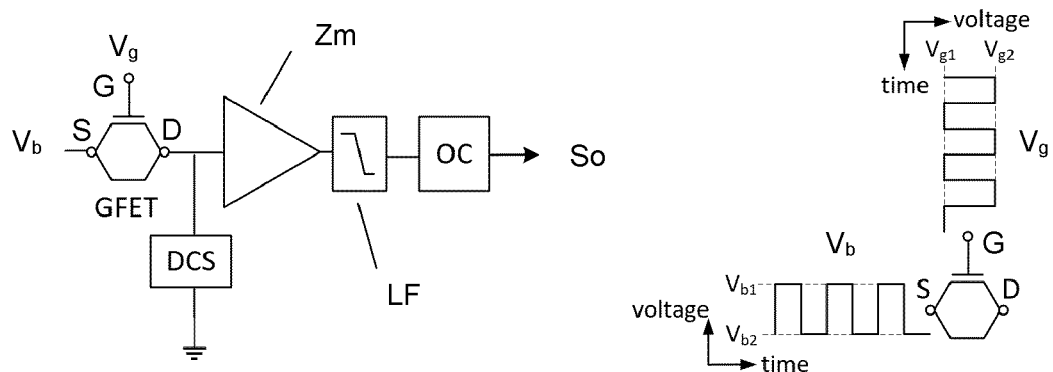
FIG. 10 is a schematic drawing of the second aspect of the present invention, for Embodiment 4, including a dark current subtraction unit (DCS) and an offset correction unit (OC). On the right an illustration of the different signal applied to the gate (G) and source (S) terminals of the GFET.

In FIG. 9 a block diagram of the control unit CU and components of Embodiment 4, including the connections between the two, is shown. Embodiment 4 does not need a signal processing unit as the processing is done by the mixing capabilities of the graphene. In FIG. 10 the implementation of this demodulation circuit is shown, while in FIG. 11 the timing sequence for this embodiment 4 is depicted.

For this Embodiment 4, as shown in FIGS. 9 and 10, the electronic device comprises:
a graphene field effect transistor GFET;
noise suppression means comprising:
a modulation unit configured to generate and continuously apply to a gate electrode structure G of said GFET a voltage oscillating time-dependent signal $V_g$ having at least one component with a frequency of $f_m$ and that oscillates between first $V_{g1}$ and second $V_{g2}$ voltage values selected so that charge carrier density of a graphene channel of the GFET is modulated around the charge neutrality point of the graphene between charge carrier density values at at least said frequency $f_m$,
a control unit CU, and
a demodulation circuit which is CMOS-implemented and is configured to, under the control of the control unit CU, generate a bias voltage oscillating time-dependent signal $V_b$ having at least one component with a frequency of $f_{mb}$ and that oscillates between first $V_{b1}$ and second $V_{b2}$ voltage values, and apply the same to a source electrode structure S of the GFET continuously, simultaneously and with a delay $t_d$ to induce a phase $\varphi=2\pi \cdot f_{mb} \cdot t_d$ with respect to the voltage oscillating time-dependent signal $V_g$ applied to the gate electrode structure G, wherein said delay $t_d$ is selected to optimize the conditions to demodulate at least an electrical signal of frequency $f_m$ of a modulated electrical current circulating through the graphene channel of the GFET when is under said modulation around the charge neutrality point of the graphene and yield a maximal demodulated output signal So.

Figure 11:
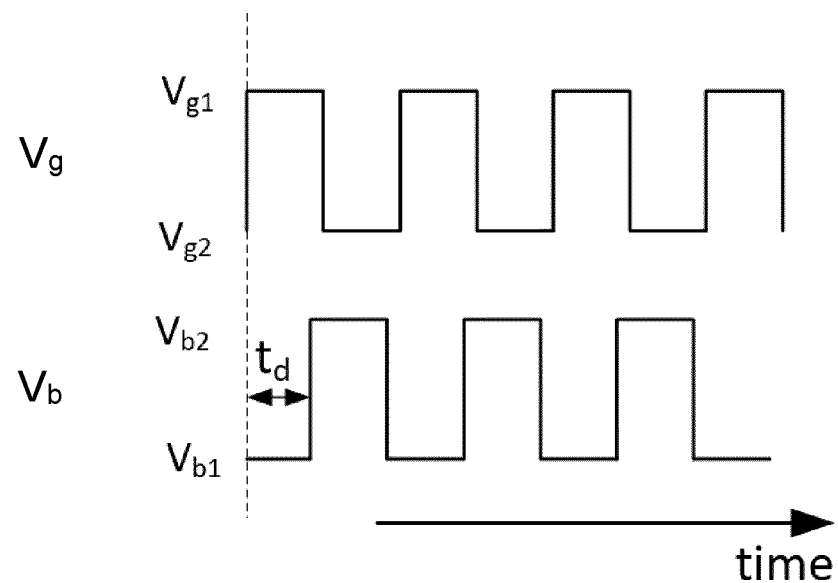
FIG. 11 shows a timing sequence for the voltage signals applied to the gate ($V_g$) and source ($V_b$) of the GFET of the device of Embodiment 4. Note that the pulse rise and fall times should be finite in reality. $t_d$ is a time delay induced between those signals ($V_g$ and $V_b$).

As shown in FIG. 11, for this Embodiment 4, the control unit CU continuously applies a voltage $V_g$ to the gate G of the GFET, alternating between $V_{g1}$ and $V_{g2}$ to modulate the charge carrier density in the graphene around the charge neutrality point. The control unit also applies continuously a bias voltage $V_b$ to the source S of the GFET alternating between $V_{b1}$ and $V_{b2}$. This voltage signal $V_b$ is applied with a time delay $t_d$ to optimize the conditions to maximize So.

The most likely implementation is that $V_{b1}$ is a positive voltage and voltage $V_{b2}$ is a negative voltage with respect to the source S of the GFET. It is however possible to operate with any DC offset between the two voltages and even put one of them to 0. As shown in FIG. 10, between the low pass filter LF an impedance matching unit Zm can be added if the low pass filter LF is passive. The low pass filter LF allows only the signal corresponding to the charge the charge induced in the graphene channel (plus a possible DC offset) pass. After the low-pass filter LF an offset correction unit OC can be added. The signal So (see FIG. 10) can be read out at any time in the described sequence.

Here, an explanation of the mixing in terms of an ideal sine wave is given. Note that the mixing can be achieved with any periodic function that can be asymmetric (i.e. positive and negative parts are not equal).

An AC bias $V_{bias}$ (i.e. $V_b$) with amplitude V1 and frequency $f_{mb}$ is applied to the source S of the GFET:

$$V_{bias}=V_1 \cos(2\pi f_{mb})$$

Using the gate G of the GFET (called also herein "gate 1"), the charge carrier density of the graphene is modulated at a frequency $f_m$ (which can be the same or different as $f_{mb}$):

$$n=C_{gate1} \cdot (V_2 \cos(2\pi f_m))$$

Where $C_{gate1}$ is the capacitance of the gate G of the GFET, and $V_2$ the amplitude of the modulation.

The conductivity of the graphene is:

$$\sigma=\sqrt{n^{*2}+n^2} \cdot e \cdot \mu$$

Where n* is the residual charge carrier density, n the average charge carrier density, e the electron charge and μ the mobility.

The average charge carrier density in the channel is a sum of the charge carrier density induced by the gate as expressed above and $n_{ind}$ which is the carrier density induced in the graphene channel.

Now the current that comes out of the mixer is as follows:

$$I = V_{bias} \cdot \sigma \cdot \frac{W}{L} =$$
$$V_1 \cos(2\pi f) \cdot \sqrt{n^{*2} + (n_{ind} + C_b V_2 \cos(2\pi f + \phi_1))^2} \cdot e \cdot \mu \cdot \frac{W}{L}$$

Where W is the width of the device and L the length of the graphene channel.

It is important to notice that, mathematically, there will only be traditional mixing when: $n^* \ll n_{ind}+C_b V_2$. To operate in this condition is not practical as it will require high voltages to be applied to the gate. In practice the device will be operated for $n^* \sim n_{ind}+C_b V_2$.

Figure 13:
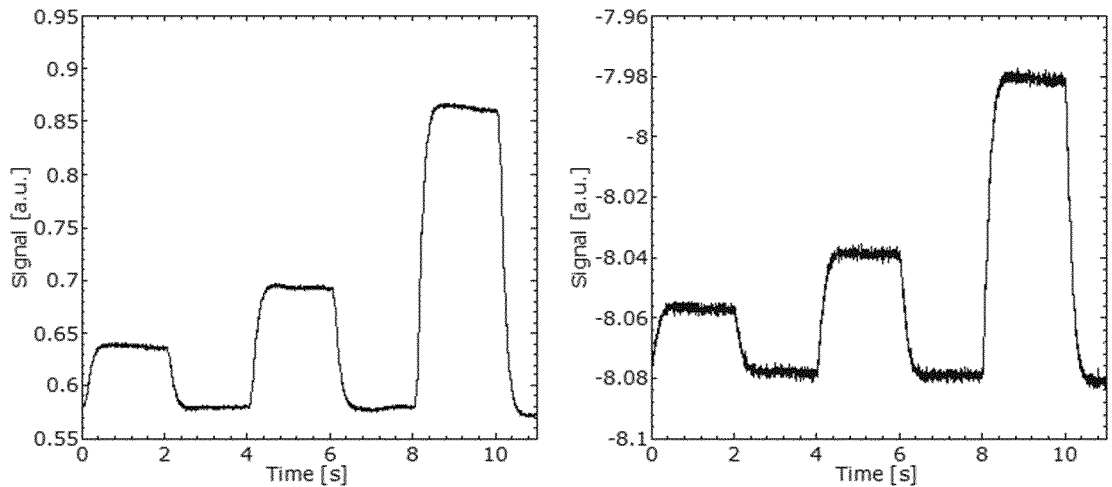
FIG. 13 shows the signal out of a real device as a response to three different $n_{ind}$ levels on the GFET with respect to $n_{ind}=0$. Note that the base level contains an offset. Left: signal of a device read using a scheme similar to the one described in Embodiment 4 (homodyne detection $f_m=f_{mb}$). Thanks to the noise suppression and mixing scheme, the signal to noise ratio is a factor 10 higher than in the Right panel: signal of a device read using a DC bias and fixed $V_g$.

From this formula it can be seen that when there is noise in the mobility it will be suppressed by using this modulation/demodulation technique. To demonstrate this, data is shown in FIG. 13, where a factor 10 lower noise compared to a DC (bias and gate voltage) read-out was achieved.

Figure 12:
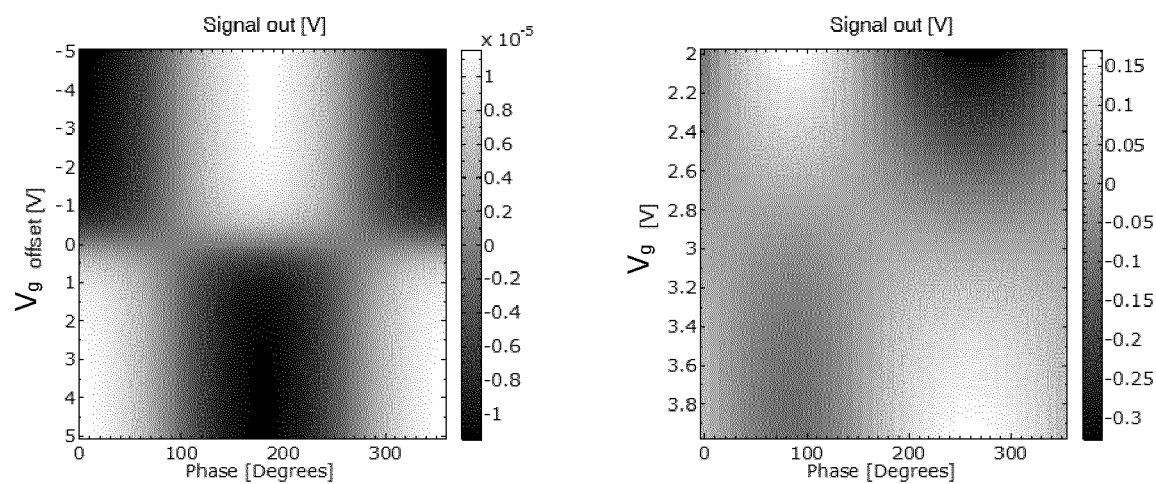
FIG. 12 shows an implementation of the device of the second aspect of the invention, for Embodiment 4. $V_g$ is a voltage applied to the gate G of the GFET that induces a charge Δn in the GFET channel. On the left: simulation of the output signal as a function of $V_g$ offset (with respect to the $V_g$ at the charge neutrality point) and the phase between the GFET source and gate offset modulation. On the right: measurement of the output signal as a function of $V_g$ and the phase between the GFET source and gate modulation. The source drain bias was modulated with an amplitude of 0.5V, gate G was modulated with amplitude of 0.5V. Both at 113 Hz (homodyne detection $f_m=f_{mb}$). Note that the charge neutrality point of this device was located at ~2.9 V.

Moreover, a simulation of Embodiment 4 based on the above formula has been performed by the present inventors, and in FIG. 12, left the results plotting So of Embodiment 4 are shown. In FIG. 12, right a measurement of the implementation of Embodiment 4 in a real device is shown, to provide proof that the scheme works.

A person skilled in the art could introduce changes and modifications in the embodiments described without departing from the scope of the invention as it is defined in the attached claims.

The invention claimed is:

1. An electronic device, comprising:
    a graphene field effect transistor (GFET); and
    a noise suppression mechanism comprising a modulation unit configured to generate and apply to a gate electrode structure of said GFET, a voltage oscillating time-dependent signal having at least one component with a frequency of $f_m$ and that oscillates between first and second voltage values selected so that charge carrier density of a graphene channel of the GFET is modulated around the charge neutrality point of the graphene between charge carrier density values at, at least, said frequency $f_m$,
    wherein said noise suppression mechanism further comprises a control unit, and a demodulation circuit which is CMOS-implemented and that comprises first and second circuital branches which are alternately switchable, under the control of said control unit, to demodulate at least an electrical signal of frequency $f_m$ of a modulated electrical current circulating through the graphene channel of the GFET when is under said modulation around the charge neutrality point of the graphene.

2. The device according to claim 1, wherein said first and second circuital branches are alternately switchable, under the control of said control unit, for respectively sampling first and second portions of at least said electrical signal of frequency $f_m$ of a modulated electrical current circulating through the graphene channel when the GFET is biased and the graphene channel is under said modulation around the charge neutrality point of the graphene.

3. The device according to claim 2, wherein said demodulation circuit further comprises:
    a high-pass filter having a cut frequency $f_{c1}<f_m$ and that electrically connects an output of the GFET through which said modulated electrical current goes out, or of a further component electrically connected to said output, with an input of said demodulation circuit; and
    a post-processing unit electrically connected to respective outputs of said first and second circuital branches to receive, under the control of said control unit, said sampled first and second portions, and configured to process the same to provide a demodulated output signal.

4. The device according to claim 3, wherein said post-processing unit is configured to process said sampled first and second portions to provide said demodulated output signal according to one or more of the following types of linear combinations: additions, subtractions, or weighted additions and subtractions.

5. The device according to claim 2, wherein each of said first and second circuital branches comprises:
    a switch configured and arranged to electrically connect or disconnect said input of the demodulation circuit with the output of the respective circuital branch, when in a respective on or off state induced by said control unit; and
    a capacitor electrically connected between said output of the respective circuital branch and a ground point and that is configured and arranged to be charged with an electrical current circulating through said switch when in said on state;
    wherein said post-processing unit is configured to receive said sampled first and second portions by measuring, under the control of said control unit, the magnitude of the electrical charge stored on the respective charged capacitor;
    and wherein the device further comprises at least one reset circuit configured and arranged to drain, under the control of the control unit, the electrical charge stored on the capacitors.

6. The device according to claim 5, wherein said demodulation circuit further comprises said further component electrically connected between said output of the GFET and said high-pass filter, wherein said further component is a transimpedance or capacitive transimpedance amplifier.

7. The device according to claim 2, wherein each of said first and second circuital branches comprises:
    a switch configured and arranged to electrically connect or disconnect said input of the demodulation circuit with the output of the respective circuital branch, when in a respective on or off state induced by said control unit;
    a capacitive transimpedance amplifier with an input electrically connected between said switch and the output of the respective circuital branch, wherein said capacitive transimpedance amplifier comprises, electrically connected in parallel with each other:
        an operational amplifier,
        a capacitor configured and arranged to be charged with an electrical current circulating through said switch when in said on state, and
        a reset circuit configured and arranged to drain, under the control of the control unit, the electrical charge stored on the capacitor;
    wherein said post-processing unit is configured to receive said sampled first and second portions by measuring, under the control of said control unit, the magnitude of the electrical signal provided by the operation amplifier when the respective capacitor is charged.

8. The device according to claim 5, wherein said control unit is configured to control said switches, said post-processing unit, and said at least one reset circuit, to operate according to a reading mode that comprises:
    inducing said on state of said switch of the first circuital branch along a time $t_{int1}$ that coincides with at least part of the time during which the first voltage value of the voltage oscillating time-dependent signal is being applied to the gate electrode structure of the GFET;
    inducing said off state of said switch of the first circuital branch;
    inducing said on state of said switch of the second circuital branch along a time $t_{int2}$ that coincides with at least part of the time during which the second voltage value of the voltage oscillating time-dependent signal is being applied to the gate electrode structure of the GFET;
    inducing said off state of said switch of the second circuital branch, once said $t_{int2}$ has lapsed;
    controlling said at least one reset circuit or reset circuits, to drain the electrical charge stored on the capacitors, after said $t_{int2}$ has lapsed;
    controlling the post-processing unit to obtain a signal out by performing, and then processing, the following measurements:
        during $t_{int1}$ or $t_{int2}$:

the magnitude of the electrical charge stored on the charged capacitor of the first circuital branch; or the magnitude of the electrical signal provided by the operation amplifier of the first circuital branch when the respective capacitor is charged;

during $t_{int2}$:

the magnitude of the electrical charge stored on the charged capacitor of the second circuital branch; or the magnitude of the electrical signal provided by the operation amplifier of the second circuital branch when the respective capacitor is charged.

9. The device according to claim 1, wherein said control unit is configured also to generate and apply to said gate electrode structure of the GFET said voltage oscillating time-dependent signal having at least one component with a frequency of $f_m$ and that oscillates between first and second voltage values.

10. The device according to claim 9, wherein the GFET further comprises a sensitizing structure arranged over said graphene channel, wherein said sensitizing structure is configured to induce charge carriers therein, wherein said sensitizing structure is an actively controlled sensitizing or functionalizing structure, and wherein the device further comprising a drift compensation mechanism to compensate an unwanted drift caused by the graphene of the GFET, said drift compensation mechanism comprising a control electrode electrically connected to said actively controlled sensitizing structure and said control unit configured to operate in a drift compensation mode.

11. The device according to claim 10, wherein in said drift compensation mode, said control unit is configured to perform the actions of said reading mode while applying to said control electrode a voltage $V_{on}$ that turns on the actively controlled sensitizing or functionalizing structure to generate charges that can be sensed by the graphene channel by changing its conductance induced by an external physical quantity, to obtain said signal out, and, once the charge stored on the capacitors is drained, perform the following actions:

applying a voltage $V_{off}$ to said control electrode, during a time $t_{int1}+t_{int2}$, to tune the actively controlled sensitizing or functionalizing structure to a condition where a change in said external physical quantity does not lead to a change in charge carrier density in the graphene channel;

inducing said on state of said switch of the first circuital branch along a time $t_{int1}$ that coincides with at least part of the time during which the first voltage value of the voltage oscillating time-dependent signal is being applied to the gate electrode structure of the GFET;

inducing said off state of said switch of the first circuital branch;

inducing said on state of said switch of the second circuital branch along a time $t_{int2}$ that coincides with at least part of the time during which the second voltage value of the voltage oscillating time-dependent signal is being applied to the gate electrode structure of the GFET;

inducing said off state of said switch of the second circuital branch, once said $t_{int2}$ has lapsed;

controlling said at least one reset circuit or reset circuits, to drain the electrical charge stored on the capacitors, after said $t_{int2}$ has lapsed;

controlling the post-processing unit to obtain a drift correction out by performing, and then processing, the following measurements representative of a drift charge:

during $t_{int1}$ or $t_{int2}$:

the magnitude of the electrical charge stored on the capacitor of the first circuital branch; or the magnitude of the electrical signal provided by the operation amplifier of the first circuital branch when the respective capacitor has been charged;

during $t_{int2}$:

the magnitude of the electrical charge stored on the capacitor of the second circuital branch; or the magnitude of the electrical signal provided by the operation amplifier of the second circuital branch when the respective capacitor has been charged;

adjust the first and second voltage values of the voltage oscillating time-dependent signal based on said drift correction out, and use said adjusted first and second voltage values to perform subsequent reading modes, to compensate said unwanted drift therein.

12. An electronic device, comprising:

a graphene field effect transistor; and a noise suppression mechanism comprising a modulation unit configured to generate and continuously apply to a gate electrode structure of said GFET a voltage oscillating time-dependent signal having at least one component with a frequency of $f_m$ and that oscillates between first and second voltage values selected so that charge carrier density of a graphene channel of the GFET is modulated around the charge neutrality point of the graphene between charge carrier density values at at least said frequency $f_m$, wherein said noise suppression mechanism means further comprises a control unit, and a demodulation circuit which is CMOS-implemented and is configured to, under the control of said control unit, generate a bias voltage oscillating time-dependent signal having at least one component with a frequency of $f_{mb}$ and that oscillates between first and second voltage values, and apply the same to a source electrode structure of the GFET continuously, simultaneously and with a delay $t_d$ to induce a phase with respect to the voltage oscillating time-dependent signal applied to the gate electrode structure, wherein said delay $t_d$ is selected to optimize the conditions to demodulate at least an electrical signal of frequency $f_m$ of a modulated electrical current circulating through the graphene channel of the GFET when is under said modulation around the charge neutrality point of the graphene and yield a maximal demodulated output signal.

13. The device according to claim 12, wherein said demodulation circuit further comprises a low-pass filter having a cut frequency $f_{c2}>f_m,f_{mb}$ and with an input that is electrically connected to a drain electrode structure of the GFET, to filter and provide at an output of the low-pass filter the electrical signal corresponding to the induced charge on the GFET channel, with or without a DC offset.

14. The device according to claim 13, wherein said low-pass filter is passive, and the device further comprises an impedance matching unit interconnected between said drain electrode structure and the input of said low-pass filter.

15. A method for suppressing noise for an electronic device according to claim 1, comprising performing the operations of said control unit of the electronic device.

16. A method for suppressing noise for an electronic device according to claim 12, comprising performing the operations of said control unit of the electronic device.

17. The device according to claim 7, wherein said control unit is configured to control said switches, said post-processing unit, and said at least one reset circuit, to operate according to a reading mode that comprises:
- inducing said on state of said switch of the first circuital branch along a time $t_{int1}$ that coincides with at least part of the time during which the first voltage value of the voltage oscillating time-dependent signal is being applied to the gate electrode structure of the GFET;
- inducing said off state of said switch of the first circuital branch;
- inducing said on state of said switch of the second circuital branch along a time $t_{int2}$ that coincides with at least part of the time during which the second voltage value of the voltage oscillating time-dependent signal is being applied to the gate electrode structure of the GFET;
- inducing said off state of said switch of the second circuital branch, once said $t_{int2}$ has lapsed;
- controlling said at least one reset circuit or reset circuits, to drain the electrical charge stored on the capacitors, after said $t_{int2}$ has lapsed;
- controlling the post-processing unit to obtain a signal out by performing, and then processing, the following measurements:
  - during $t_{int1}$ or $t_{int2}$:
    - the magnitude of the electrical charge stored on the charged capacitor of the first circuital branch; or
    - the magnitude of the electrical signal provided by the operation amplifier of the first circuital branch when the respective capacitor is charged;
  - during $t_{int2}$:
    - the magnitude of the electrical charge stored on the charged capacitor of the second circuital branch; or
    - the magnitude of the electrical signal provided by the operation amplifier of the second circuital branch when the respective capacitor is charged.

* * * * *